United States Patent [19]
Sabyeying

[11] Patent Number: 6,028,350
[45] Date of Patent: Feb. 22, 2000

[54] LEAD FRAME WITH STRIP-SHAPED DIE BONDING PAD

[75] Inventor: Watana Sabyeying, Nonthabury Province, Thailand

[73] Assignee: Advanced Micro Devices, Inc., Sunnyvale, Calif.

[21] Appl. No.: 09/020,673

[22] Filed: Feb. 9, 1998

[51] Int. Cl.[7] .................................................. H01L 23/495
[52] U.S. Cl. ........................... 257/670; 257/676; 257/666
[58] Field of Search ................................... 257/666, 670, 257/669, 676

[56] References Cited

U.S. PATENT DOCUMENTS 5,162,895  11/1992  Takahashi et al. .
5,521,428   5/1996  Hollingsworth et al. ................ 257/670
5,714,792   2/1998  Przano ..................................... 257/667
5,796,162   8/1998  Huang .

*Primary Examiner*—Sheila V. Clark

[57] ABSTRACT

A lead frame, comprises a pair of spaced apart rail portions and a plurality of leads therebetween for attachment to a semiconductor die and defining an area for accommodating a semiconductor device. A single, narrow, strip shaped tie bar of substantially constant width extends between and substantially perpendicular to the rail portions and traverses a narrow portion of the die receiving area. A die pad portion is provided for bonding to the die intermediate the ends of the strip.

14 Claims, 4 Drawing Sheets

LEAD FRAME WITH STRIP-SHAPED DIE BONDING PAD

FIELD OF THE INVENTION

The present invention relates to semiconductor devices that employ lead frames having die bonding pads.

BACKGROUND OF THE INVENTION

Semiconductor devices packaged in plastic or resin encapsulants typically include portions of a lead frame. More specifically, the frames include a plurality of leads electrically coupled to a semiconductor die and a support member, referred to as a die pad, on which the die is mounted. In many instances, the die pad is configured as a solid plate that is slightly larger in area than the semiconductor die and made of the same material as the other portions of the lead frame, for example, copper, a copper alloy, or a plated material. In other instances, the die pad is configured as a circular or square-shaped plate of substantially smaller area than that of the semiconductor die. Each of the conventional types of die pad configurations has drawbacks and disadvantages, as will be described infra.

An example of a conventional die pad configuration is shown in FIG. 1 in simplified form for illustrative convenience, and comprises lead frame 10 having top and bottom spaced apart parallel strip-shaped rails 11 and 12, with tie bar 13 extending substantially perpendicularly therebetween and including a paddle-shaped die pad 14 in a central region thereof. Die pad 14 can be integrally formed with the tie bar 13 or can be separately formed and affixed to the tie bar by any conventional method. In addition, lead frame 10 includes a plurality of inner leads 15 and outer leads 16 integrally formed with each other and connected by dambars 17. The arrangement of inner leads 15 defines an area 18 for receiving a semiconductor die 19 supported on die pad 14. As illustrated, semiconductor die 19 is slightly larger in area than the underlying die pad 14.

In order to assemble a semiconductor package, a bonding material, such as an epoxy-based adhesive, is conventionally applied to the exposed upper surface of the die pad or to the lower surface of the semiconductor die and subjected to a curing process utilizing a clamping device for applying heat and/or pressure to the die pad/adhesive/semiconductor die composite to effect bonding between the die and the die pad. Thereafter, a wire bonding step is performed to electrically connect the inner leads 15 of the lead frame 10 to bond pads on the upper surface of the semiconductor die by wires 20, typically comprising gold, aluminum or alloys thereof.

Subsequent to lead bonding, the assembly is subjected to a plastic encapsulation process in which the lead frame/bonded die assembly is held within a mold into which a molten mold compound (polymeric resin) is injected and subjected to a curing process, such that the outer lead portions extend outside of the molded body. The extending portions of the outer leads are then bent into a desired configuration for use.

In addition to the obvious drawbacks of the above die pad configuration, such as the large amount of metallic material required for the paddle-shaped die pad, along with a correspondingly large adhesive requirement, several additional drawbacks are incurred with the FIG. 1 configuration. For example, since the edge of the die pad is close to the inner leads, adhesive material which is squeezed out around the edges of the pad as a result of compression and increased fluidity during the bonding/curing process, contacts and contaminates the inner leads or flows upwardly toward the bond pads on the upper surface of the semiconductor die, thereby deleteriously affecting device performance, especially when the adhesive is not sufficiently insulative.

Another, less apparent drawback attendant upon the use of large area die pads is package cracking of plastic encapsulated semiconductor devices, which arises from a combination of factors. One factor is internal delamination between the plastic encapsulant material and the die pad of the lead frame. The lead frame and associated die pad typically comprise copper or a copper alloy and, therefore have a coefficient of thermal expansion (CTE) which in most instances is different than that of the surrounding encapsulant material. As a result of this CTE mismatch, stress is created at the encapsulant/die pad interface as the semiconductor device experiences temperature changes. Upon reaching a maximum threshold, the stress is relieved through delamination of the encapsulant/die pad interface.

Another factor associated with delamination in the paddle-type die pad configuration is poor adhesion between the die pad and conventional adhesive epoxies used to attach the semiconductor die to the die pad. Typically, an epoxy adhesive is applied to the die pad of the lead frame. Upon bonding the semiconductor die to the die pad, the epoxy is dispersed, such that it forms a thin, continuous layer beneath the entire die. While conventionally employed epoxy adhesives bond well to the surface of the semiconductor die, adhesion between the epoxy and the die pad is not as strong. Therefore, under certain stress conditions, delamination between the die and the die pad occurs.

Several prior approaches to reduce internal delamination involve increasing adhesion between the die pad and the plastic encapsulant. In one such approach, the surface of the die pad is roughened to increase the surface area available for bonding. In another such approach, the die pad area is reduced relative to the area of the semiconductor die to provide a correspondingly greater area of plastic encapsulant/semiconductor die interface. However, the latter approach, whether employing, for example, a small square-shaped die pad 14 supported by a single, very narrow tie bar 13, such as shown in FIG. 2, or a small circular-shaped die pad 14 supported by at least one tie bar 13, as shown in FIG. 3, disadvantageously lacks sufficient robustness. For example, as shown in FIG. 4, lifting of die pad 14, separation (delamination) of die 19 from bonding adhesive 21, and/or upward bowing of tic bar 13, as shown in FIG. 4, occurs during wire bonding or other processing prior to encapsulation. Such lack of robustness and propensity for pad lifting and tie bar bowing are attributed to the very small area of die pad attachment to the semiconductor die and insufficient tie bar stiffness.

Yet another drawback associated with the use of die pads supported on tic bars of insufficient mechanical robustness, whether the die pad is large or small, is illustrated in FIGS. 5 and 6. Referring to FIG. 5, a lead frame comprises top and bottom rail portions 11 and 12, respectively, which support die pad 14 via tie bars 13. A semiconductor die 19 is bonded to die pad 14 and the inner leads (not shown for illustrative simplicity) are connected in a conventional manner. Thereafter, the assembly of the die 19, die pad 14, inner leads, and inner portions of the tie bars 13 are molded together using a plastic molding compound or resin 21. Molding is conducted by holding the semiconductor die 19, die pad 14, and tie bars 13 in position using a mold having a molding material injection port 22 and a cavity 23 communicating with injection port 22. Molding material 21, in a molten state, is injected within the cavity (indicated by arrows) to fill the entire cavity 23..

As molding material 21 is injected from injection port 22, the molding material forcefully impinges upon the end surfaces of the die pad 14 and semiconductor die 19, whereby they become twisted due to torsional force applied by the flowing molding material along the longitudinal axis of the tie bars 13. Such torsional force is proportional to the die pad area as well as the pressure applied to the injected molding material. The result is schematically shown in FIG. 6, which corresponds to a view taken along line 5—5 of FIG. 5. As seen, semiconductor die 19 and associated die pad 14 are twisted by an angle θ about the tie bars 13. If the stress distribution within the cured encapsulant 21 is uneven, a crack, such as indicated at 24, may be formed. Reference numeral 25 represents the outer leads.

Package cracking can result in lead wire rupture and/or moisture penetration. Once moisture accumulates in the package, rapid temperature increases (such as are experienced during solder reflow operations) will cause the moisture to vaporize and expand, thereby creating an internal pressure pocket, leading to delamination or further package cracking.

There is a need for semiconductor technology which avoids the above-mentioned problems and drawbacks attendant upon conventional packaging configurations, such as delamination. There also exists a need to simplify semiconductor packaging technology enabling to avoid the need for a different or customized lead frame design for each product, thereby reducing manufacturing costs.

SUMMARY OF THE INVENTION

It is, therefore, an object of the present invention to provide a lead frame including a strip-shaped integral tie bar and die pad which overcomes the disadvantages and drawbacks of lead frames having conventional die pad configurations.

It is a further object to provide a lead frame with a strip-shaped integral tie bar and die pad which provides improved robustness and reduced tendency for lift-off of a semiconductor die.

It is a still further object to provide a lead frame with a strip-shaped integral tie bar and die pad which requires less metal material and adhesive than conventional configurations.

It is yet another object to provide a lead frame with a strip-shaped integral tie bar and die pad which is simple to manufacture and capable of accommodating different sizes of semiconductor dies.

It is a still further object to provide a semiconductor device including a semiconductor die bonded to a strip-shaped die pad integrally formed with a tie bar of a lead frame.

Additional objects, advantages, and other features of the present invention will be set forth in the description which follows and in part will become apparent to those having ordinary skill in the art upon examination of the following or may be learned from the practice of the invention. The objects and advantages may be realized and obtained as particularly pointed out in the appended claims.

According to the present invention, the foregoing and other objects are achieved in part by a lead frame structure comprising: a pair of elongated, spaced apart, substantially parallel rail portions; a plurality of leads between the rail portions, the leads adapted for attachment to a semiconductor die receivable within the lead frame, the leads having inner lead portions for connection to the die and outer lead portions for providing external contacts to the die, the inner lead portions defining an area for receiving the die; a single narrow, strip-shaped tie bar of substantially constant width having substantially parallel opposed sides and extending between and substantially perpendicular to the rail portions, the tie bar traversing a correspondingly narrow central portion of the die receiving area; wherein a portion of the tie bar intermediate its ends defines a die pad area for bonding to a surface of a semiconductor die.

The present invention also provides a semiconductor device, comprising a lead frame including: a pair of elongated, spaced apart, substantially parallel rail portions; a plurality of leads within the space between the rail portions, the leads attached to a semiconductor die received within the lead frame, the leads having inner lead portions connected to the die and outer lead portions providing external contacts to the die, the inner lead portions defining an area for receiving the die; a single narrow, strip-shaped tie bar of substantially constant width having substantially parallel opposed sides and extending between and substantially perpendicular to the rail portions, the tie bar traversing a correspondingly narrow central portion of the die receiving area; and a portion of the tie bar intermediate its ends defining a die pad area; a semiconductor die accommodated within the die receiving area, the die attached to and supported in a narrow central area portion thereof by the die pad area; and connection means electrically connecting the semiconductor die to the inner lead portions of the lead frame.

Additional objects and advantages of the present invention will become readily apparent to those skilled in this art from the following detailed description, wherein only the preferred embodiments of the invention arc shown and described, simply by way of illustration but not limitation. As will be realized, the invention is capable of other and different embodiments, and its several details are capable of modification in various obvious respects, all without departing from the spirit of the invention. Accordingly, the drawings and description are to be regarded as illustrative in nature, and not as restrictive.

DESCRIPTION OF THE INVENTION

Figure 7:
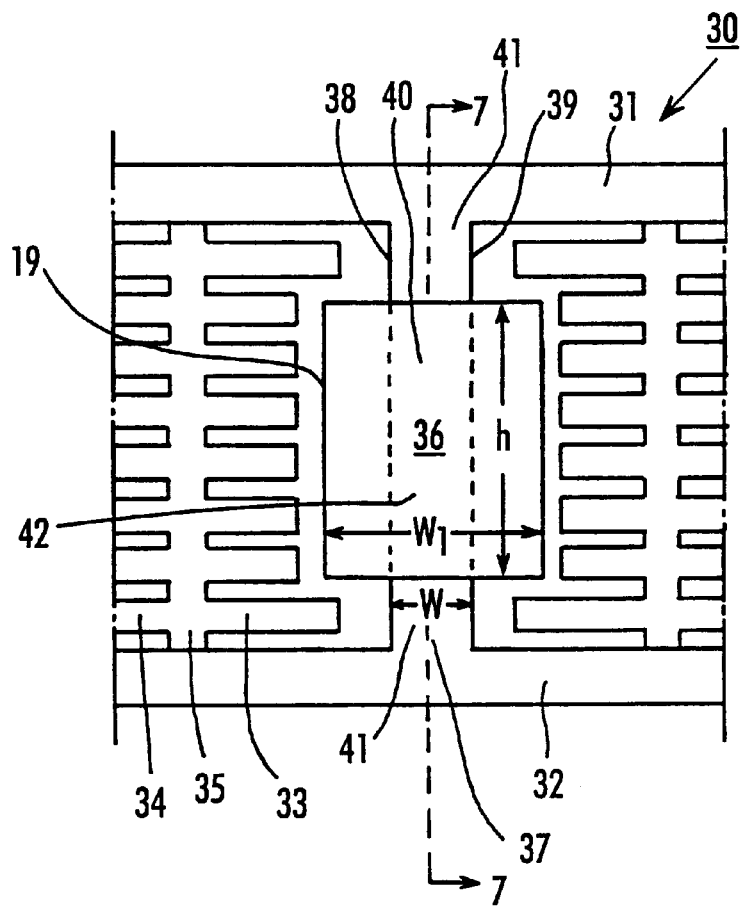
FIG. 7 is a simplified schematic plan view of an embodiment of the invention.

An embodiment of the present invention is illustrated in FIG. 7, wherein lead frame 30 comprises a pair (i.e., top and bottom) of elongated, spaced apart, substantially parallel rail portions 31 and 32. Arrayed between the rails are a plurality of inner leads 33 and outer leads 34 separated by dam bars 35, for attachment to a semiconductor die, the arrangement of leads defining an area 36 of width "$w_1$" and height "h" for receiving semiconductor die 19. As apparent from FIG. 7, dies of different sizes up to a maximum width $w_1$ and maximum height h can be accommodated in area 36. In a departure from conventional tie bar/die pad configurations, the tie bar and die pad according to embodiments of the present invention do not comprise distinct portions having different dimensions. Rather, a single, narrow strip 37, of substantially constant width "w" and substantially parallel opposed sides 38 and 39 extends between and substantially perpendicular to the top and bottom frame rails 31 and 32 and across a central portion 40 of the die receiving area 36. Strip 37 comprises both tie bar portions 41 at opposite ends thereof for attachment to the top and bottom frame rail portions 31, 32 and die pad portion 42 intermediate the tie bar portions 41. The relative lengths of the die pad and tie bar portions are determined by the height dimension "h" of the particular semiconductor die 19 accommodated within the die receiving area 36.

Figure 8:
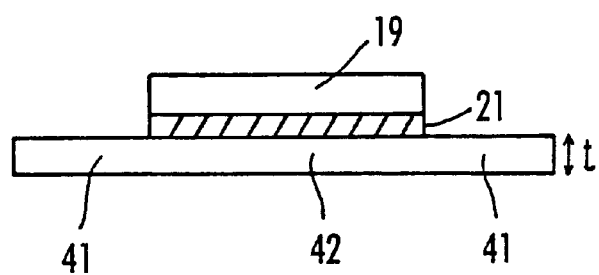
FIG. 8 is a partial schematic cross-sectional view taken along line 7—7 of FIG. 7 and illustrating the decreased tendency for pad lifting provided by the tie bar/die pad configuration of the invention.

As used herein, the term "narrow" denotes a strip of width "w" which is less than width "$w_1$" of the die receiving area 36 or the die 19. The lead frame, including the tie bar/die pad strip and the leads defining the die receiving area can be formed of a material such as copper or a copper alloy, by conventional techniques. Referring to FIG. 8, the thickness "t" of at least the strip 37 and the length of the tie bar portions 41 is selected to prevent sagging or bowing in the longitudinal direction. In addition, the width "w" of the strip is selected to prevent torsional rotation about its longitudinal axis when bonded to a semiconductor die and subjected to encapsulation molding.

Figure 1:
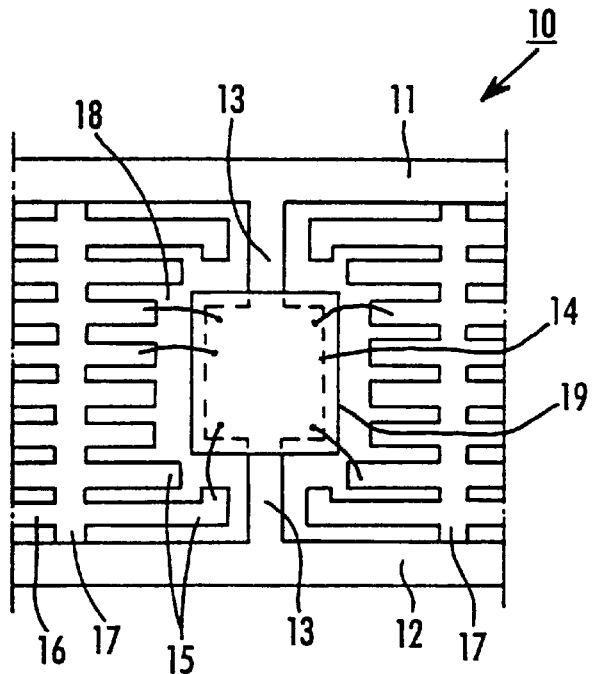
FIGS. 1–3 are simplified plan views of lead frames having conventional die pad configurations.
Figure 2:
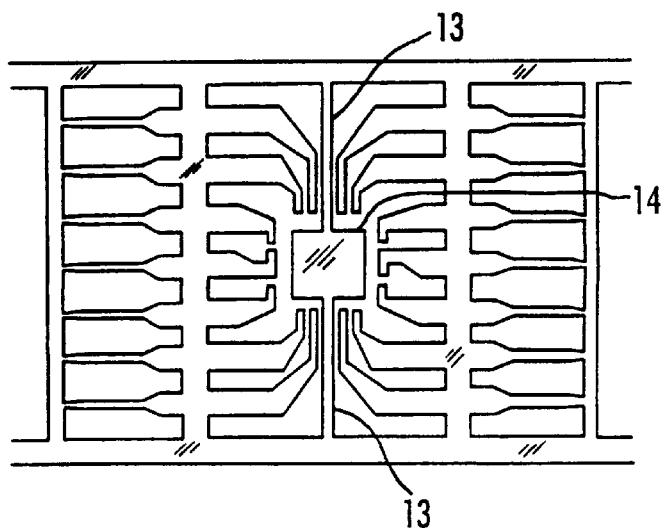
Figure 3:
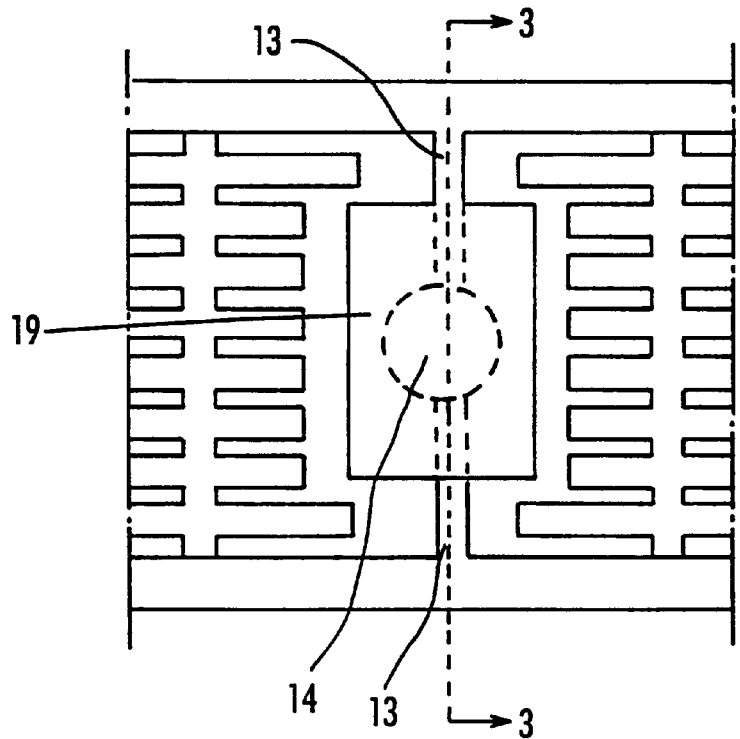
Figure 4:
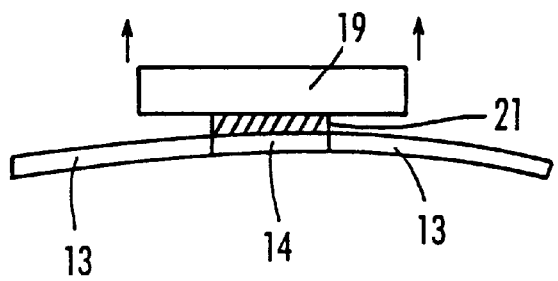
FIG. 4 is a partial schematic cross-sectional view taken along line 3—3 of FIG. 3 and illustrating pad lifting and tie bar bowing which occurs with conventional die pad/tie bar configurations.
Figure 5:
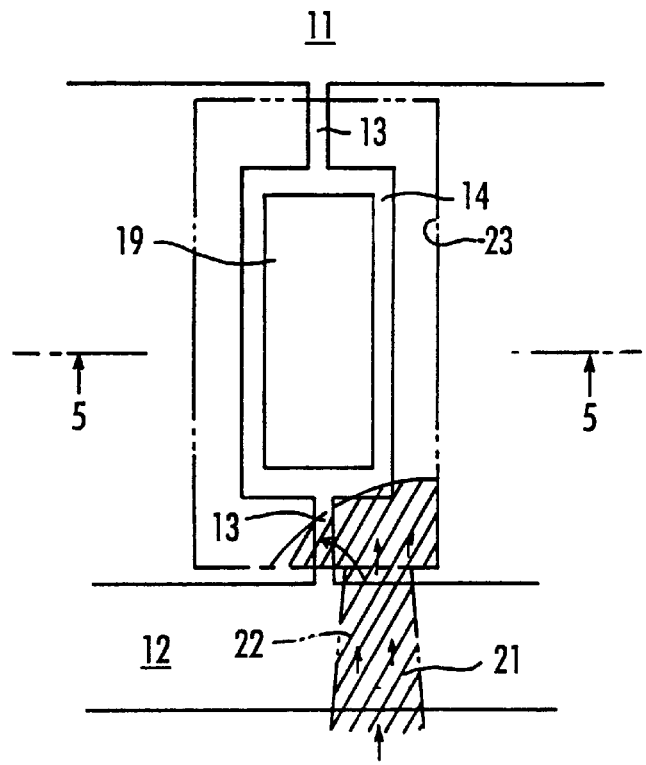
FIG. 5 is a schematic plan view illustrating injection of molding material into a mold cavity during encapsulation of a semiconductor device comprising a conventional die pad/tie bar configuration.
Figure 6:
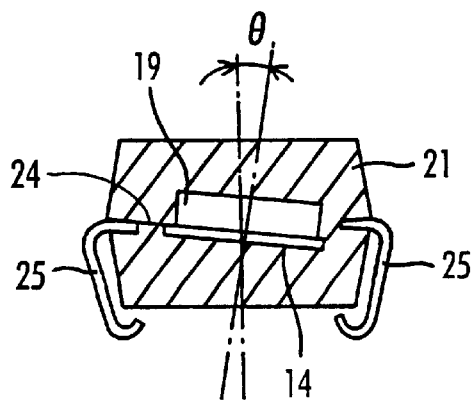
FIG. 6 is a schematic cross-sectional view taken along line 5—5 of FIG. 5 and illustrating torsional twisting of a die pad and semiconductor die bonded thereto.

Referring again to FIG. 8, in the depicted embodiment the present invention, adhesive material 21 is applied to the entire length of the die pad area 42, which length corresponds to the height "h" of the semiconductor die. The attendant increase in bonded area relative to the case shown in FIG. 4 for a small-area die pad ("spot" bonding) provides a significant increase in resistance to lift-off. Moreover, bowing or sagging of the strip is minimized by the present invention due to the rigidity imparted by the large area of cured adhesive resin supported on tie bar of width "w". In addition to the above advantages provided by the invention, contamination of electrical contacts due to fluidized excess adhesive squeezed out around the periphery of the die pad and/or semiconductor die during the die bonding process is minimized as a result of centrally positioning the narrow die pad inwardly of the die perimeter.

The use of a strip-shaped integral tie bar/die pad in accordance with embodiments of the present invention overcomes the drawbacks and disadvantages of conventional semiconductor packaging configurations. The present invention advantageously reduces lead frame and adhesive material requirements relative to large paddle-shaped die pad configurations, provides increased adhesion and reduced lift-off tendency relative to small area die pad configurations, reduces adhesive contamination, and allows a single lead frame configuration to be used with a variety of differently sized semiconductor dies, thereby reducing manufacturing costs. The present invention enjoys utility in packaging various types of semiconductor devices for various industrial applications.

Only a preferred embodiment of the present invention and an example of its utility are shown and described in the present invention. It is to be understood that the invention is susceptible of changes or modifications within the scope of the inventive concept as expressed herein.

What is claimed is:

1. A lead frame for a semiconductor device, the lead frame comprising:
    a pair of elongated, spaced apart, substantially parallel rail portions;
    a plurality of leads between said pair of rail portions, said leads adapted for attachment to a semiconductor die to be received within said lead frame, said leads having inner lead portions for connection to said die and outer lead portions for providing external contacts to said die, the inner lead portions defining an area for receiving said die;
    a single narrow, strip-shaped tie bar of substantially constant width having substantially parallel opposed sides and extending from one of said pair of rail portions to the other of said pair of rail portions and substantially perpendicular thereto, said tie bar traversing a correspondingly narrow central portion of said die receiving area;
    wherein a portion of said tie die intermediate the ends thereof defines a die pad area for bonding to a surface of said die.

2. A lead frame as in claim 1, wherein the length of said intermediate portion substantially corresponds to a transverse dimension of said die.

3. The lead frame as in claim 1, wherein the thickness of said tie bar and the length of said intermediate portion thereof are sufficient to prevent sagging or bowing along its longitudinal dimension when bonded to a semiconductor die.

4. The lead frame as in claim 1, wherein the width of said tie bar is sufficient to prevent torsional rotation about its longitudinal axis when bonded to a semiconductor die.

5. The lead frame as in claim 1, wherein said lead frame is made of a material comprising copper or a copper alloy.

6. A semiconductor device, comprising:
    a lead frame including:
        a pair of elongated, spaced apart, substantially parallel rail portions;
        a plurality of leads between said pair of rail portions, the leads attached to a semiconductor die received within said lead frame, said leads having inner lead portions connected to said die and outer lead portions providing external contacts to said die, the inner lead portions defining an area for receiving said die;
        a single narrow, strip-shaped tie bar of substantially constant width having substantially parallel opposed sides and extending from one of said pair of rail portions to the other of said pair of rail portions and substantially perpendicular thereto, said tie bar traversing a correspondingly narrow central portion of said die receiving area; and
        a portion of said tie bar intermediate the ends thereof defining a die pad area;
    a semiconductor die accommodated within said die receiving area, the die attached to and supported in a narrow central area portion thereof by said die pad area; and
    connection means electrically connecting the semiconductor die to the inner lead portions of the lead frame.

7. The semiconductor device as in claim 6, wherein the length of the intermediate portion corresponds to a transverse dimension of the semiconductor die.

8. The semiconductor device as in claim 7, wherein the semiconductor die is bonded to the entire length of the intermediate portion of the tie bar defining the die pad area.

9. The semiconductor device as in claim 8, wherein said semiconductor die is bonded to the tie bar by an adhesive.

10. The semiconductor device as in claim 9, wherein said adhesive is an epoxy-based adhesive.

11. The semiconductor device as in claim 6, wherein the thickness of the tie bar and the length of the intermediate portion thereof are sufficient to prevent sagging or bowing along its longitudinal dimension.

12. The semiconductor device as in claim 6, wherein the width of the tie bar is sufficient to prevent torsional rotation about its longitudinal axis.

13. The semiconductor device as in claim 6, wherein the lead frame is made of a material comprising copper or a copper alloy.

14. The semiconductor device as in claim 6, further comprising a body of encapsulant material surrounding the semiconductor die and the inner lead portions of the plurality of leads.

* * * * *